United States Patent
Du et al.

(10) Patent No.: US 7,679,365 B2
(45) Date of Patent: Mar. 16, 2010

(54) CURRENT LEAD OF SUPERCONDUCTING MAGNET OF MAGNETIC RESONANCE SYSTEM

(75) Inventors: Xi Yang Du, Shenzhen (CN); Huai Yu Pan, Shenzhen (CN); Zhong You Ren, Shenzhen (CN); Xing En Yu, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 214 days.

(21) Appl. No.: 12/022,282

(22) Filed: Jan. 30, 2008

(65) Prior Publication Data

US 2008/0180105 A1    Jul. 31, 2008

(30) Foreign Application Priority Data

Jan. 30, 2007    (CN) .................. 2007 1 0063174

(51) Int. Cl.
*G01V 3/00*    (2006.01)
(52) U.S. Cl. ........................ 324/319; 324/300
(58) Field of Classification Search ......... 324/300–322; 600/407–432; 505/230, 231, 704–706, 879, 505/884, 887; 335/216; 165/104.21; 62/6, 62/51.5
See application file for complete search history.

(56) References Cited

U.S. PATENT DOCUMENTS

| 5,861,788 A * | 1/1999 | Ohkura et al. .............. 335/216 |
| 7,260,941 B2 * | 8/2007 | van Hasselt ...................... 62/6 |
| 7,430,872 B2 * | 10/2008 | Strobel ........................ 62/51.1 |
| 2005/0204751 A1 * | 9/2005 | White et al. .................. 62/51.1 |
| 2007/0182513 A1 * | 8/2007 | Burgess et al. ................. 335/18 |
| 2009/0212891 A1 * | 8/2009 | Hickman .................... 335/216 |

* cited by examiner

*Primary Examiner*—Brij B Shrivastav
(74) *Attorney, Agent, or Firm*—Schiff Hardin LLP

(57) ABSTRACT

A current lead for the superconducting magnet of a magnetic resonance system, the superconducting magnet being refrigerated by a cold head, has a positive current lead and a negative current lead electrically connected to the superconducting magnet for magnetization thereof. The cold head is electrically connected to the superconducting magnet and is used as one of the positive and negative current leads. The cold head is used as the positive current lead or the negative current lead so as to reduce the number of current leads as well as the heat conducted by the current lead, therefore it maintains a stable superconducting environment more efficiently. Furthermore, the cold head and the current lead can be provided in the same conduit without the need to design a separated turret tube and side tube, and the structure of the current leads of the superconducting magnet of the magnetic resonance system is simplified.

8 Claims, 3 Drawing Sheets

CURRENT LEAD OF SUPERCONDUCTING MAGNET OF MAGNETIC RESONANCE SYSTEM

BACKGROUND OF THE INVENTION

1. Field of the Invention

The present invention relates to a current lead, and more particularly to a current lead of a superconducting magnet for magnetic resonance.

2. Description of the Prior Art

In a superconducting type of magnetic resonance system, a superconducting magnet is magnetized by a current provided gradually by a magnet power supply in a low temperature environment, i.e. at the temperature of the liquid helium of an absolute temperature value of 4.2 K (−269°), so as to build up the magnetic field; once the magnetization is accomplished, since the coil is at a superconducting status, there is no need to provide a power supply to the superconducting magnet, as long as a stable superconducting environment is maintained, therefore a highly stable and uniform magnetic field is achieved.

An important condition for a superconducting type of magnetic resonance system to be successfully magnetized and to work in a stable manner is to establish and maintain a stable superconducting environment. Once the superconducting environment is damaged, this leads to the quenching of the superconducting magnet. After quenching, the economic losses due to restarting the refrigeration, magnetization as well as those due to the downtime of the magnetic resonance system are very large.

The superconducting magnet requires for its magnetization a specialized high precision power supply system, which is placed in an environment of room temperature, and it supplies the power to the superconducting magnet in the superconducting environment through current leads. Heat can be conducted to the superconducting magnet via the current leads, thus the superconducting environment is affected. At the same time, when it is magnetized or demagnetized, a huge current of a few hundred amperes will pass through the current leads, and due to the resistance in the current leads themselves, the ohm heat resulting from the resistance under the effects of the huge current can also be conducted to the superconducting magnet, thus affecting the superconducting environment.

In the prior art, usually two types of current leads are used to supply the power to the superconducting magnet; one is a detachable current lead, and the other is a fixed current lead. When using the detachable current leads, the detachable current leads are electrically connected to the superconducting magnet only when the superconducting magnet needs to be magnetized or demagnetized, and they are separated from the superconducting magnet when the superconducting magnet is in a stable superconducting status. Since the detachable current leads are not electrically connected to the superconducting magnet for most of the time, external heat is effectively prevented from being conducted to the superconducting magnet via the current leads; however such detachable current leads have a complex structure and they require handling by an experienced person when they are connected to or detached from the superconducting magnet. When the fixed current leads are used, the fixed current leads are always connected to the superconducting magnet. In this case, it is unavoidable for the external heat to be conducted to the superconducting magnet via the current leads, however such fixed current leads are convenient in operation, and as the refrigeration capability of refrigeration devices is being improved, the shortcoming caused by the heat conduction is compensated to a certain degree, therefore in the superconducting type of magnetic resonance systems the fixed current leads are increasingly used in practical commercial applications.

Referring to FIG. 1, in a prior art connection device of the fixed current leads, a superconducting magnet 70 is submerged in liquid helium within a liquid helium container 60, the current leads 40 are provided in a turret tube 50 in communication with the liquid helium container 60, and the current leads are electrically connected to an external power supply system and the superconducting magnet 70 respectively to supply the power to said superconducting magnet 70. Said current leads 40 comprise the leads used respectively as a positive current lead and a negative current lead. A superconducting switch 30 is connected between the positive current lead and the negative current lead to control the superconducting magnet 70. A cold head 10 is provided in a side tube (Sidesock) 20 in communication with the liquid helium container 60, to be used for refrigeration. As described above, this current lead connecting device would conduct external heat to the superconducting magnet 70 via the current leads 40 and the ohmic heat resulting from the strong current passing through the current lead 40 would also be conducted to the superconducting magnet 70, leading to the evaporation of the liquid helium due to the heat in the liquid helium container 60 and the damage to the superconducting environment. In addition, in such a current lead connecting device, the current leads 40 and the cold head 10 are provided in the turret tube 50 and the side tube 20 respectively, leading to a complicated structure for the current lead connecting device.

FIG. 2 shows an improved current lead connecting device, in which the differences between it and the current lead connecting device shown in FIG. 1 are: the current lead 40 is only used as the positive current lead and a side wall of the turret tube 50 is used as the negative current lead. The advantage of this improved current lead connecting device is the reduced number of current leads 40, however although a part of the heat conducted from outside to the superconducting magnet 70 through the current lead 40 is reduced, the difficulty for designing and producing the turret tube 50 is increased, because not only the heat conduction property but also the mechanical properties as well as the electric conduction properties of said turret tube 50 need to be considered. In the same way as the current lead connecting device shown in FIG. 1, the current lead 40 and the cold head 10 of this improved current lead connecting device are provided in the turret tube 50 and the side tube 20 respectively, leading to the complicated structure of the current lead connecting device.

SUMMARY OF THE INVENTION

An object of the present invention is to provide a current lead for a superconducting magnet of the magnetic resonance system with a simple structure to effectively reduce the heat conducted from outside to the superconducting magnet via the current lead.

The above object described is achieved in accordance with the present invention by a current lead for a superconducting magnet of the magnetic resonance system, in which said superconducting magnet is refrigerated by a cold head, the current lead for the superconducting magnet having a positive current lead and a negative current lead electrically connected to the superconducting magnet to supply power thereto, and said cold head is electrically connected with the superconducting magnet and is used as one of the positive and negative current leads. The cold head is electrically connected to the superconducting magnet via a thermoelectrical coupler.

According to one aspect of the present invention, the cold head is used as the negative current lead of the superconducting magnet, and a current lead is used as the positive current lead of the superconducting magnet.

According to another aspect of the present invention, the superconducting magnet is submerged in liquid helium in a liquid helium container. The current lead is provided in a turret tube in communication with the liquid helium container, and the cold head is provided in a side tube in communication with the liquid helium container. Optionally, both the current lead and the cold head can be provided in a turret tube or a side tube in communication with the liquid helium container.

In the present invention, the cold head is used as the negative current lead to reduce the number of current leads and also to reduce the heat conducted through the current lead. The stability of the superconducting environment can be maintained more effectively. In the present invention, the cold head can also be used as the positive current lead, and a side wall of the side tube is used for electrical connection to said superconducting magnet as the negative current lead, so as also to achieve the effect described above. Moreover, in the present invention the cold head and the electrical lead can be provided in the same turret tube or the side tube, thus the turret tube and the side tube need not be designed separately, which very much simplifies the structure of the current lead of the superconducting magnet of the magnetic resonance system in the present invention.

DESCRIPTION OF THE PREFERRED EMBODIMENTS

Figure 3:
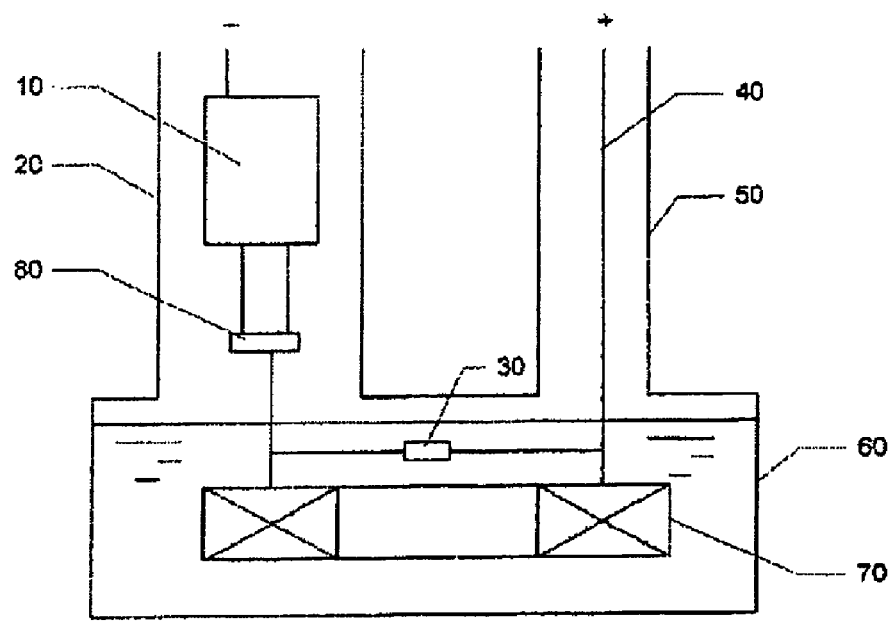
FIG. 3 is a schematic illustration of a first embodiment of the current lead of the superconducting magnet of the magnetic resonance in the present invention, in which a current lead is used as the positive current lead, a cold head is used as the negative current lead, and the current lead and the cold head are provided respectively in the turret tube and the side tube.

Referring to FIG. 3, in the first embodiment of the current lead of the superconducting magnet of the magnetic resonance in the present invention, a superconducting magnet 70 is submerged in liquid helium within a liquid helium container 60, a current lead 40 is provided in a turret tube 50 in communication with the liquid helium container 60 and electrically connected to the positive end of an external power supply system and said superconducting magnet 70 respectively, so as to be used as the positive current lead of the superconducting magnet 70. A cold head 10 is provided in a side tube 20 in communication with the liquid helium container 60, to be used for refrigeration so as to maintain the superconducting environment. At the same time, the cold head 10 is electrically connected to the negative end of the external power supply system and the superconducting magnet 70 via a thermoelectrical coupler 80, so as to be used as the negative current lead of the superconducting magnet 70. A superconducting switch 30 is connected between the positive current lead and the negative current lead to control the superconducting magnet 70.

The differences between the current lead connecting device in this embodiment and those of the prior art are: the reduced number of current leads 40, in this embodiment the current lead 40 only comprises the lead used as the positive current lead of the superconducting magnet 70, while the cold head 10 is used as the negative current lead of the superconducting magnet 70.

Alternatively, the current lead 40 can include only the lead used as the negative current lead of the superconducting magnet 70, while the cold head 10 is used as the positive current lead of said superconducting magnet 70. However, since the negative current lead and the side tube 20 are usually grounded, it is preferable for the current lead 40 to be used as the positive current lead and the cold head 10 is used as the negative current lead in this embodiment.

The advantages of the current lead connecting device in this embodiment compared with that of the prior art are that by using the cold head 10 as the negative current lead it reduces the number of current leads 40 and also reduces the heat conducted through the current lead, therefore it can maintain a stable superconducting environment more effectively.

Figure 4:
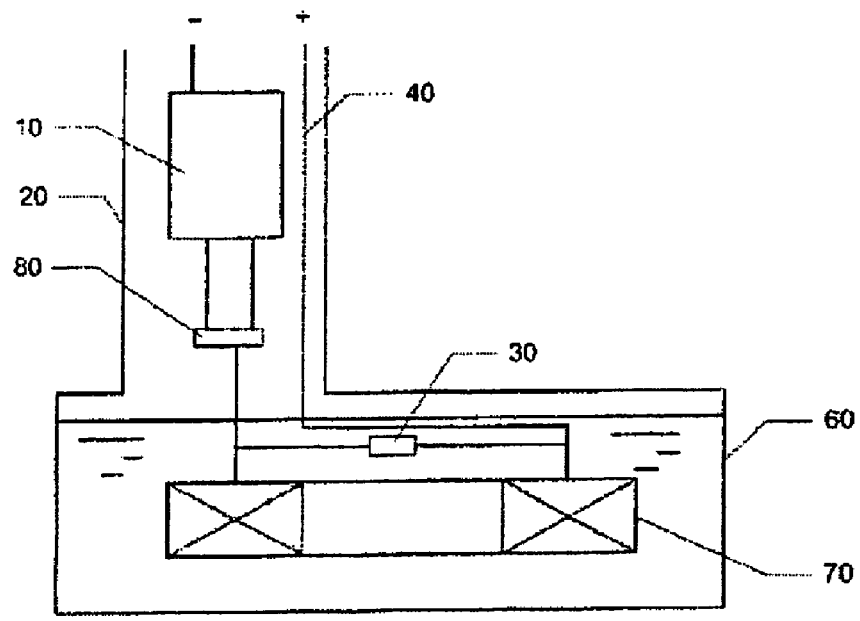
FIG. 4 is a schematic illustration of a second embodiment of the current lead of the superconducting magnet of the magnetic resonance in the present invention, in which a current lead is used as the positive current lead, a cold head is used as the negative current lead, and the current lead and the cold head are both provided in the side tube.

FIG. 4 shows the second embodiment of the current lead of the superconducting magnet of the magnetic resonance in the present invention, and this embodiment is basically the same as the first embodiment mentioned above, so the same elements are designated by the same numerals, and wherein the differences between them are as follows. In the first embodiment shown in FIG. 3, the current lead 40 as the positive current lead and the cold head 10 as the negative current lead are separately placed in the turret tube 50 and the side tube 20 in communication with said liquid helium container 60, and this design results in a complicated structure for the current lead of the superconducting magnet of the magnetic resonance in the present invention. In the embodiment of FIG. 4, the current lead 40 as the positive current lead and the cold head 10 as the negative current lead are both placed in the side tube 20, so as to dispense with the turret tube 50 and to lead to a simple structure for the current lead of the superconducting magnet of the magnetic resonance in the present invention. It will be understood that in this embodiment, the current lead 40 as the positive current lead and the cold head 10 as the negative current lead can also be placed in the turret tube 50 so as to dispense with the side tube 20 and to produce a simple structure for the current lead of the superconducting magnet of the magnetic resonance in the present invention.

Figure 5:
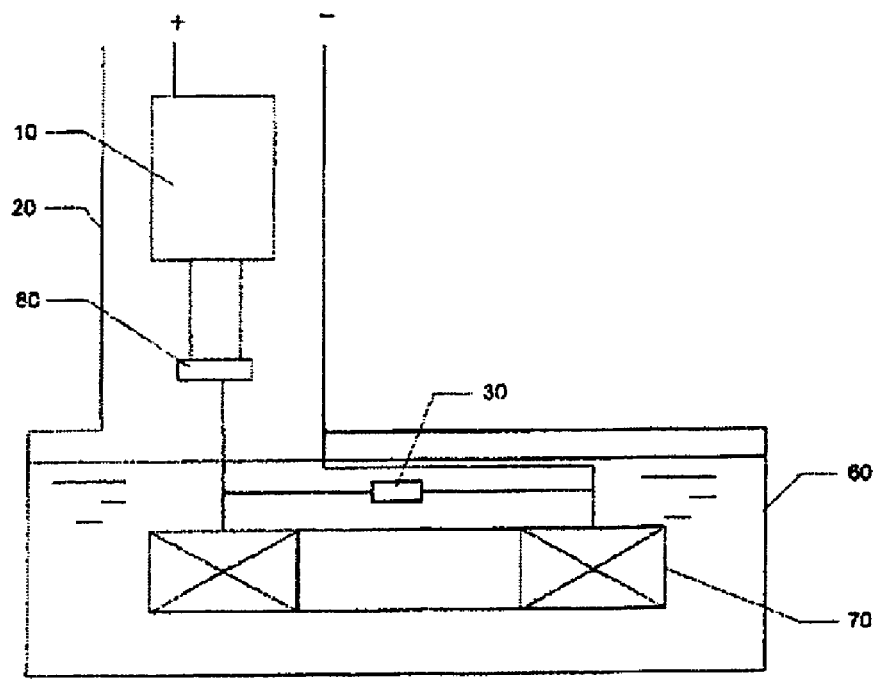
FIG. 5 is a schematic illustration of a third embodiment of the current lead of the superconducting magnet of the magnetic resonance in the present invention, wherein a cold head is used as the positive current lead and a side wall of the side tube is used as the negative current lead.

FIG. 5 shows the third embodiment of the current lead of the superconducting magnet of the magnetic resonance in the present invention, and this embodiment is basically the same as the second embodiment described above, so the same elements are designated by the same numerals and wherein the differences between them are as follows. In the second embodiment shown in FIG. 4, the current lead 40 is used as the positive current lead and the cold head 10 is used as the negative current lead. In the embodiment of FIG. 5, the cold head 10 is used as the positive current lead to dispense with the current lead 40 and one side wall of the side tube 20 is electrically connected with said superconducting magnet 70 as the negative current lead. In this embodiment, since the temperature of the side wall of the side tube 20 (specifically around the liquid helium container 60) is relatively low, external heat can hardly be conducted to said superconducting magnet 70 via the side wall of the side tube 20, therefore it can keep a stable superconducting environment more effectively. Since in this embodiment said cold head 10 is used as the positive current lead, it only needs to keep it insulated from the side tube 20; while since a side wall of the side tube 20 is used as the negative current lead, not only the heat conduction property but also the mechanical properties as well as the electric conduction property should be considered when said side tube is designed and produced. It will be understood that in this embodiment, the side tube 20 can be replaced by the turret tube shown in FIG. 3.

Figure 1:
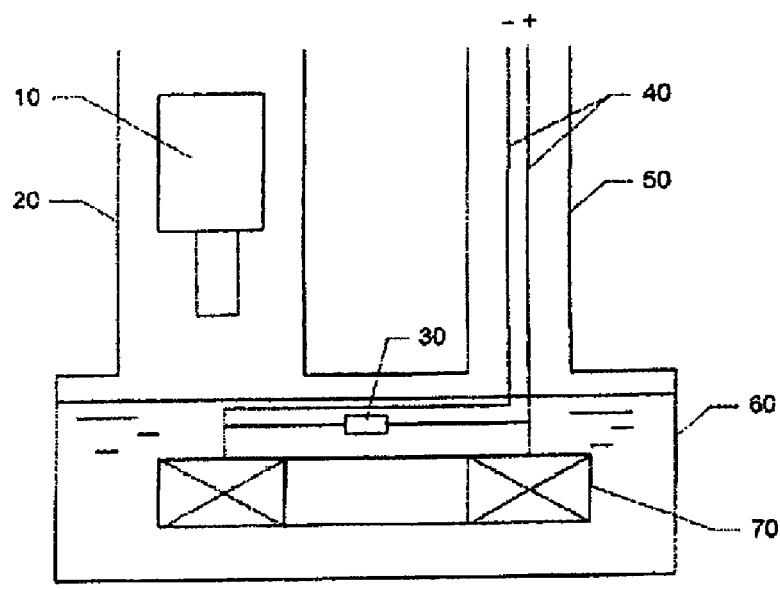
FIG. 1 is a schematic illustration of a current lead connecting device in the prior art, in which the current leads are divided into a positive current lead and a negative current lead.
Figure 2:
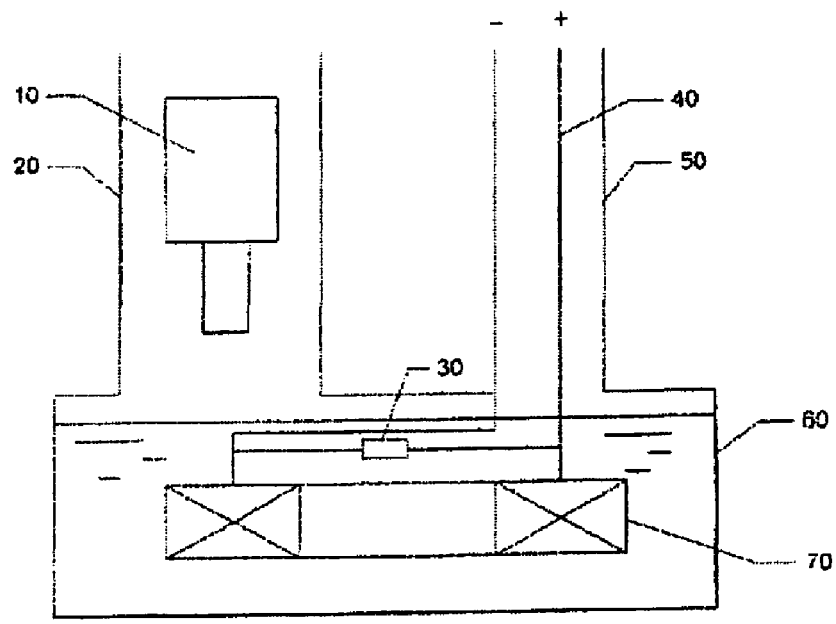
FIG. 2 is a schematic illustration of an improved current lead connecting device, in which a side wall of the turret tube is used as a negative current lead.
Figure 6:
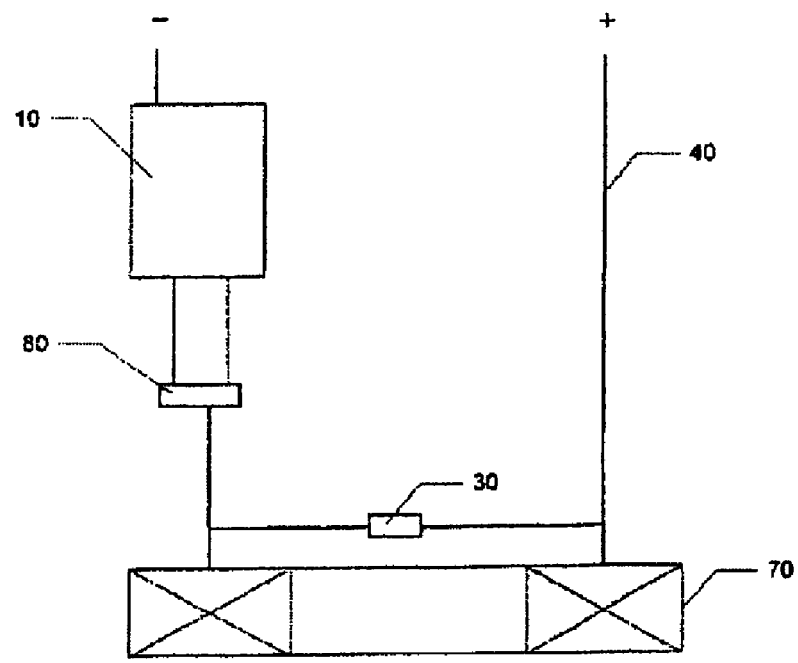
FIG. 6 is a schematic illustration of a fourth embodiment of the current lead of the superconducting magnet of the magnetic resonance in the present invention, which is applied to the dry magnet, wherein a current lead is used as the positive pole of the current lead and a cold head is used as the negative current lead.

FIG. 6 shows the fourth embodiment of the current lead of the superconducting magnet of the magnetic resonance in the present invention, and this embodiment is basically the same as the first embodiment described above, so the same elements are designated by the same numerals. and wherein the differences between them are as follows. In the first embodiment shown in FIG. 3 is for the superconducting magnet 70 being refrigerated by liquid helium, but this embodiment is applied to a dry magnet in which instead of the liquid helium, the superconducting magnet 70 is refrigerated by conductive cooling. In this embodiment, as in the first embodiment in FIG. 3, the current lead 40 is used as the positive current lead and the cold head 10 is used as the negative current lead to reduce the number of current leads 40 and the heat conducted via the current lead, therefore it can keep a stable superconducting environment more effectively. Moreover, since conductive cooling of a dry magnet is adopted in this embodiment, the liquid helium container 60 and liquid helium therein, and the turret tube 50 and side tube 20 in communication with the liquid helium container 60 shown in FIG. 1 are dispensed with respectively.

In summary, the present invention provides a current lead for a superconducting magnet of the magnetic resonance system with a simple structure to effectively reduce the heat conducted from outside to the superconducting magnet via the current lead. Although the illustrated embodiments are described in conjunction with the accompanying drawings, it should be understood that the present invention is not limited to the embodiments described above and the change and adaptation of the present invention can be readily made by those skilled in the art without departing from the scope and the spirit of the present invention.

We claim as our invention:

1. A current lead for a superconducting magnet of a magnetic resonance system, said superconducting magnet being refrigerated by a cold head, said current lead comprising:
   a positive current lead and a negative current lead electrically connected with the superconducting magnet for magnetization thereof; and
   said cold head being electrically connected with the superconducting magnet and forming one of said positive current lead or said negative current lead.

2. A current lead as claimed in claim 1 wherein said cold head forms the negative current lead, and comprising a separate current lead used as said positive current lead of said superconducting magnet.

3. A current lead as claimed in claim 2 wherein said superconducting magnet is a dry magnet refrigerated by said cold head by conduction.

4. A current lead as claimed in claim 2 wherein said superconducting magnet is submerged in liquid helium in a liquid helium container.

5. A current lead as claimed in claim 4 comprising a turret tube in communication with the liquid helium container, and wherein said cold head comprises a side tube in communication with said liquid helium container.

6. A current lead as claimed in claim 4 wherein said separate current lead and said cold head are provided in a tube in communication with said liquid helium container.

7. A current lead as claimed in claim 1 wherein said cold lead forms the positive current lead of the superconducting magnet and is provided in a tube, said tube having a sidewall that is electrically connected to the superconducting magnet as said negative current lead.

8. A current lead as claimed in claim 1 wherein said cold head is connected to said superconducting magnet via a thermo-electrical coupler.

* * * * *